United States Patent
Funk et al.

(10) Patent No.: US 12,272,520 B2
(45) Date of Patent: Apr. 8, 2025

(54) PROCESS CONTROL ENABLED VDC SENSOR FOR PLASMA PROCESS

(71) Applicant: Tokyo Electron Limited, Tokyo (JP)

(72) Inventors: Merritt Funk, Austin, TX (US); Peter Ventzek, Austin, TX (US); Alok Ranjan, Austin, TX (US); Barton Lane, Austin, TX (US); Justin Moses, Austin, TX (US); Chelsea DuBose, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 115 days.

(21) Appl. No.: 16/506,202

(22) Filed: Jul. 9, 2019

(65) Prior Publication Data

US 2021/0013005 A1 Jan. 14, 2021

(51) Int. Cl.
    *H01J 37/32* (2006.01)
    *C23C 16/509* (2006.01)
    *H01L 21/67* (2006.01)
    *H01L 21/683* (2006.01)

(52) U.S. Cl.
    CPC ...... *H01J 37/32091* (2013.01); *C23C 16/509* (2013.01); *H01J 37/32174* (2013.01); *H01J 37/3244* (2013.01); *H01J 37/32559* (2013.01); *H01L 21/67109* (2013.01); *H01L 21/6831* (2013.01)

(58) Field of Classification Search
    USPC ........................................ 156/345.24, 345.28
    See application file for complete search history.

(56) References Cited

U.S. PATENT DOCUMENTS

| | | | |
|---|---|---|---|
| 5,989,349 A | 11/1999 | Ke et al. | |
| 6,582,977 B1 * | 6/2003 | Rodriguez | H01L 22/34 438/3 |
| 7,514,934 B2 | 4/2009 | Shuto et al. | |

(Continued)

FOREIGN PATENT DOCUMENTS

| | | |
|---|---|---|
| JP | 2013243418 A | 12/2013 |
| JP | 5397464 B2 | 1/2014 |

(Continued)

OTHER PUBLICATIONS

Korean Intellectual Property Office, The International Search Report and the Written Opinion for International application No. PCT/US2020/037872, mailed Sep. 24, 2020, 12 pg.

(Continued)

*Primary Examiner* — Ram N Kackar
(74) *Attorney, Agent, or Firm* — Slater Matsil, LLP (57) ABSTRACT

In one exemplary embodiment described herein are innovative plasma processing methods and system that utilize direct measurement of direct current (DC) field or self-bias voltage (Vdc) in a plasma processing chamber. In one embodiment, a non-plasma contact measurement using the electric field effect from Vdc is provided. The Vdc sensing method may be robust to a variety of process conditions. In one embodiment, the sensor is integrated with any focus ring material (for example, quartz or doped-undoped silicon). Robust extraction of the Vdc measurement signal may be used for process control. In one embodiment, the sensor may be integrated, at least in part, with the substrate being processed in the chamber.

23 Claims, 10 Drawing Sheets

(56) References Cited

U.S. PATENT DOCUMENTS

| | | | |
|---|---|---|---|
| 7,712,435 B2 | 5/2010 | Yoshizaki et al. | |
| 7,837,828 B2 | 11/2010 | Ikeda et al. | |
| 10,018,484 B2 | 7/2018 | Sugita et al. | |
| 10,083,883 B2 | 9/2018 | Tedeschi et al. | |
| 10,553,411 B2 | 2/2020 | Chen et al. | |
| 2006/0249729 A1* | 11/2006 | Mundt | G01N 33/0004 257/48 |
| 2008/0099881 A1* | 5/2008 | Jung | H01L 29/0804 257/E29.174 |
| 2009/0092033 A1* | 4/2009 | Buehlmann | G11B 9/1409 369/126 |
| 2013/0203258 A1* | 8/2013 | Chen | H01J 37/32504 438/710 |
| 2013/0228323 A1 | 9/2013 | Makabe et al. | |
| 2014/0231389 A1* | 8/2014 | Nagami | H01J 37/32706 216/67 |
| 2014/0354263 A1* | 12/2014 | Brodzeli | G01R 29/12 324/96 |
| 2015/0068316 A1* | 3/2015 | Woerdenweber | H01L 29/516 427/430.1 |
| 2016/0139190 A1* | 5/2016 | Baglio | G01R 33/06 324/457 |
| 2018/0012784 A1* | 1/2018 | Eto | H01L 21/3065 |
| 2018/0366300 A1 | 12/2018 | Jung et al. | |
| 2018/0366305 A1 | 12/2018 | Nagami | |

FOREIGN PATENT DOCUMENTS

| | | |
|---|---|---|
| KR | 1020190011316 A | 2/2019 |
| TW | 201440140 A | 10/2014 |
| TW | 201711078 A | 3/2017 |
| TW | 201921417 A | 6/2019 |
| WO | 2006011954 A2 | 2/2006 |

OTHER PUBLICATIONS

International Bureau, Patent Cooperation Treaty, Notification Concerning Transmittal of International Preliminary Report of Patentability (Chapter 1 of the Patent Cooperation Treaty), PCT/US2020/037872, Jan. 20, 2022, 8 pages.

Powell, Janine, "The Importance of DC Self-Bias Voltage in Plasma Applications," PTI Blog, https:www.palomartechnologies.co/blog/the-importance-of-dc-self-bias-voltage-in-plasma-applications, Jun. 1, 2016, 4 pages.

Yin, "The origins of self-bias on dielectric substrates in RF plasma processing," Surface & Coatings Technology 200 (2006), pp. 3670-3674, Oct. 28, 2004, 5 pages.

Taiwanese Decision of Refusal, Taiwanese Patent Application No. 109122562, mailed Nov. 7, 2024, 16 pages.

* cited by examiner

PROCESS CONTROL ENABLED VDC SENSOR FOR PLASMA PROCESS

BACKGROUND

The present disclosure relates to the processing of substrates in plasma process apparatus. In particular, it provides an apparatus and method to monitor plasmas generated in plasma processing apparatus.

The use of plasma systems for the processing of substrates has long been known. For example, plasma processing of semiconductor wafers is well known. The plasma systems may be typically utilized for a plasma etching process and/or plasma deposition process. Plasma processing presents numerous technical challenges and as geometries for structures and layers on substrates continue to shrink, control of the plasma becomes increasingly important. In general, plasmas are generated by supplying high frequency electrical power to gas mixtures in a chamber that separate the plasma from surrounding environment. Performance of plasma processes is impacted by a number of variables including species, density, and kinetic energy of ions, reactive neutrals, etc.

In order to achieve desired process performance, variable settings of the plasma processing equipment can be adjusted to change the plasma properties. These settings include, but are not limited to gas flow rates, gas pressure, electrical power for the plasma excitation, bias voltages, etc., all as is known in the art. One of the challenges to achieve desired performance is controllability of the plasma properties. Since the variable settings are not directly related to the plasma properties, there are limitations for the control. As the requirements of substrate processing are becoming more and more challenging, better controllability of the plasma properties is needed.

In a plasma system, the DC field between the substrate and the plasma sheath, is commonly called the DC voltage, or direct current (DC) voltage (Vdc) The Vdc in a plasma system is one parameter that is known to impact ion energy at the substrate. Vdc is particularly important in plasma etch processes as generally higher Vdc values lead to higher rates of ion etching. Vdc may be impacted by a number of system variables including but not limited to mechanical configurations of the plasma process chamber, chamber pressure, chamber gases, radio frequency (RF) power applied, etc., all which are well known in the art. It would be desirable to better monitor and control Vdc.

SUMMARY

In one exemplary embodiment, described herein are innovative plasma processing methods and systems that utilize direct measurement of Vdc in a plasma processing chamber. In one embodiment, a non-plasma contact measurement using the electric field effect from Vdc is provided. The Vdc sensing method may be robust to a variety of process conditions. In one embodiment, the sensor is integrated with a focus ring material (for example, quartz or doped-undoped silicon). In another embodiment, the sensor is integrated with a chuck of the plasma processing system. In yet another, embodiment, the sensor is integrated with a substrate (in one example a wafer) that is placed in the plasma processing system. Robust extraction of the Vdc measurement signal may be used for process control.

The pickup surface of an electric displacement field measurement sensor (which may be a Vdc sensor) may be located at the surface of a focus ring of the plasma system, in the plasma process system chuck, at outer edge dielectric areas of the plasma system or even integrated in a substrate placed in the plasma system. When outside of the substrate, using a conductive or non-conductive plasma-facing surface enables a variety of substrate doping levels to be accounted for. The use of Vdc sensor techniques enables better process control and factory level process monitoring of the plasmas generated in a plasma system. In one embodiment, the use of a non-contact sensor design minimizes process non-uniformity issues. Further, the use of a ring sensor embodiment allows measurement of Vdc uniformity.

As mentioned, the pickup surface of the sensor may alternatively be located inside a substrate (for example at the surface of a wafer) using ultra small electronics to provide embedded sensor pickups, with minimal plasma surface disturbance. Thus, the substrate sensor provides a substrate based sensor for chamber-to-chamber matching and building models for measurements near the substrate surface.

In one embodiment, the electric displacement field measurement sensor may be a capacitive sensor. The capacitance of the capacitive sensor may be impacted by the Vdc levels present in the plasma system, thus providing a direct measurement of the Vdc levels. More particularly, the DC voltage dependence of the capacitance seen across a dielectric field may be advantageously utilized to provide a measurement of the Vdc. Specifically, changes in the detected capacitance can be utilized to provide a measurement of the Vdc present.

In one embodiment, a plasma processing system configured to process a substrate is provided. The system may comprise a plasma chamber comprising a substrate holder and an radio frequency (RF) source configured to apply an RF field to the plasma chamber. The system further includes an electric displacement field measurement sensor, the electric displacement field measurement sensor configured to measure an electric displacement field caused by an RF plasma, the electric displacement field measurement sensor detecting a change in polarization of a ferroelectric material by an electric field (Vdc), the change in polarization resulting from exposure to the RF plasma.

In another embodiment, a plasma processing system configured to process a substrate is provided. The plasma processing system may comprise a plasma chamber and a radio frequency (RF) source configured to apply an RF field to the plasma chamber and generate an electric field (Vdc) in the plasma chamber. The system further includes an electric displacement field measurement sensor within the plasma processing system, the electric displacement field measurement sensor having a capacitive layer, changes in a capacitance of the capacitive layer indicative of a Vdc value calculated by a relationship of the electric field and dielectric properties that change with varying electric field applied to the electric displacement field measurement sensor. The system also includes control electronics coupled to the electric displacement field measurement sensor, the control electronics detecting the Vdc value based on the changes in the capacitance of the capacitive layer.

In another embodiment, a method for operating a plasma processing system is provided. The method includes providing a plasma chamber, generating a radio frequency (RF) field in the plasma chamber and generating an electric field voltage (Vdc) in the plasma chamber. The method further includes providing a capacitive electric displacement field voltage sensor, the capacitive electric displacement field voltage sensor having a ferroelectric material. The method also includes detecting an electric displacement field voltage by monitoring capacitive changes of the capacitive electric displacement field voltage sensor, and utilizing the detected Vdc to operate the plasma processing system.

In another embodiment, a method of operating a plasma processing system is provided. The method may comprise providing a plasma chamber, applying a radio frequency (RF) field to the plasma chamber, and generating an electric field (Vdc) in the plasma chamber. The method further includes providing a substrate having an electric displacement field measurement sensor within the plasma processing system, the electric displacement field measurement sensor having a capacitive layer, changes in a capacitance of the capacitive layer indicative of a Vdc value of the plasma chamber. The method also includes determining the Vdc value based on the changes in capacitance of the capacitive layer.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Improved plasma processing results may be obtained through monitoring of Vdc in plasma systems. In one exemplary embodiment described herein are innovative plasma processing methods and systems that utilize direct measurement of Vdc in a plasma processing chamber. In one embodiment, a non-plasma contact measurement using the electric field effect from Vdc is provided. The Vdc sensing method may be robust to a variety of process conditions. In one embodiment, the sensor is integrated with a focus ring material (for example, quartz or doped-undoped silicon) of the plasma system. In another embodiment, the sensor is integrated with a chuck of the plasma system. In yet another embodiment, the sensor is integrated within a substrate (in one example a wafer) placed in the plasma system. Robust extraction of the Vdc measurement signal may be used for process control.

The pickup surface of an electric displacement field measurement sensor (which may be a Vdc sensor) may be located at the surface of a focus ring of the plasma system, in the plasma process system chuck, at outer edge dielectric areas of the plasma system or even integrated in a substrate placed in the plasma system. When outside of the substrate, using a conductive or non-conductive plasma-facing surface enables a variety of substrate doping levels to be accounted for. The use of Vdc sensor techniques enables better process control and factory level process monitoring of the plasmas generated in a plasma system. In one embodiment, the use of a non-contact sensor design minimizes process non-uniformity issues. Further, the use of a ring sensor embodiment allows measurement of Vdc uniformity.

As mentioned, the pickup surface of the sensor may alternatively be located inside a substrate (for example at the surface of a wafer) using ultra small electronics to provide embedded sensor pickups, with minimal plasma surface disturbance. In one embodiment, the sensor may be embedded on or near the substrate surface and may be connected to other electronics placed on the surface which collect and record the measurements obtained by the sensor. The substrate may then be removed from the plasma system so that the measurement data may be downloaded from the substrate using known techniques. Thus, the substrate sensor provides a substrate based sensor for chamber-to-chamber matching and building models for measurements near the substrate surface.

In one embodiment, the electric displacement field measurement sensor may be a capacitive Vdc sensor. The capacitance of the capacitive sensor may be impacted by the Vdc levels present in the plasma system, thus providing a direct measurement of the Vdc levels. More particularly, the DC voltage dependence of the capacitance seen across a dielectric field may be advantageously utilized to provide a measurement of the Vdc. Specifically, changes in the detected capacitance can utilized to provide a measurement of the Vdc present.

Figure 1:
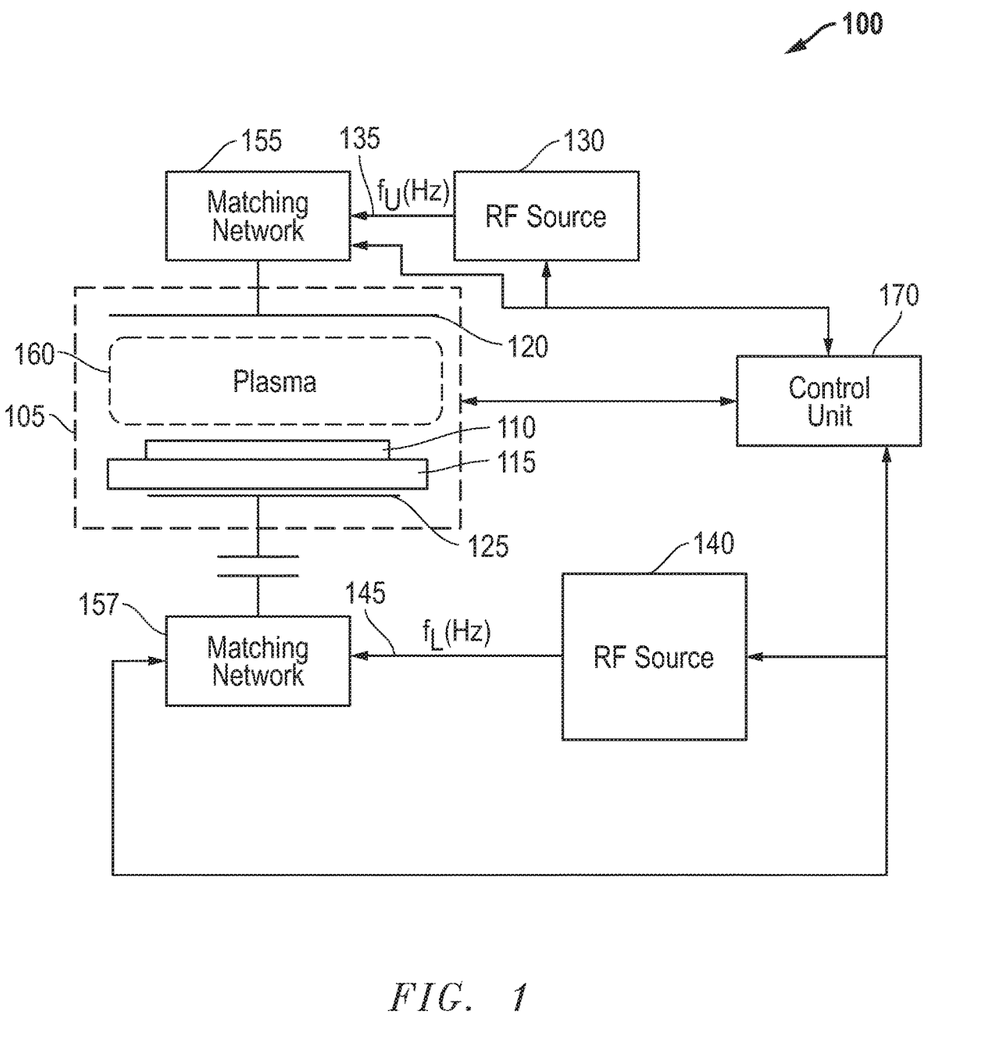
FIG. 1 illustrates an exemplary plasma processing system.

The techniques described herein may be utilized with a wide range of plasma processing systems. For example, the techniques may be utilized with plasma etch process systems, plasma deposition process systems or any other plasma process system. FIG. 1 illustrates one exemplary embodiment of plasma processing system 100 merely for illustrative purposes.

It will be recognized that other plasma process systems may equally implement the concepts described herein. For example, the plasma processing system 100 may be a capacitively coupled plasma processing apparatus, inductively coupled plasma processing apparatus, microwave plasma processing apparatus, RLSA™ microwave plasma processing apparatus, electron cyclotron resonance (ECR) plasma processing apparatus, etc. Thus, it will be recognized by those skilled in the art that the techniques described herein may be utilized with any of a wide variety of plasma processing systems. The plasma processing system 100 can be used for a wide variety of operations including, but not limited to, etching, deposition, cleaning, plasma polymerization, plasma-enhanced chemical vapor deposition (PECVD), atomic layer deposition (ALD) and so forth. The structure of a plasma processing system 100 is well known, and the particular structure provided herein is merely exemplary.

As shown in the exemplary system of FIG. 1, a plasma processing system 100 may include a plasma process chamber 105. As is known in the art, plasma process chamber 105 may be a pressure controlled chamber. A substrate 110 (in one example a semiconductor wafer) may be held on a stage or chuck 115. An upper electrode 120 and a lower electrode 125 may be provided as shown. It will be recognized that the electrode 125 and the chuck 115 may be one unit. Further, though not shown, it will be recognized that various gas injection system mechanisms may be provided to supply processing gases to the plasma process chamber 105, such as for example a gas shower head and the like. The upper electrode 120 may be electrically coupled to an upper RF source 130 through an upper matching network 155. The upper RF source 130 may provide an upper frequency voltage 135 at an upper frequency $f_U$. The lower electrode 125 may be electrically coupled to a lower RF source (for example a bias source) 140 through a lower matching network 157. The lower RF source 140 may provide a lower frequency voltage 145 at an lower frequency $f_L$. Though not shown, it will be known by those skilled in the art that a voltage may also be applied to the chuck 115. Further, it will be recognized that the sources can supply multiple frequencies and may be continuous wave sources or pulsing sources.

Components of the plasma processing system 100 can be connected to, and controlled by, a control unit 170 which in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma processing chamber with various microfabrication techniques. It will be recognized that control unit 170 may be coupled to various components of the plasma processing system 100 to receive inputs from and provide outputs to the components.

The control unit 170 can be implemented in a wide variety of manners. For example, the control unit 170 may be a computer. In another example, the control unit may be comprised off one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g., memory storage devices, Flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

In operation, the plasma processing apparatus uses the upper and lower electrodes to generate a plasma 160 in the plasma process chamber 105 when applying power to the system from the upper RF source 130 and the lower RF source 140. Further, as is known in the art, ions generated in the plasma 160 may be attracted to the substrate 110. The generated plasma can be used for processing a target substrate (such as substrate 110 or any material to be processed) in various types of treatments such as, but not limited to, plasma etching, chemical vapor deposition, treatment of semiconductor material, glass material and large panels such as thin-film solar cells, other photovoltaic cells, and organic/inorganic plates for flat panel displays, etc.

Application of power results in a high-frequency electric field being generated between the upper electrode 120 and the lower electrode 125. Processing gas delivered to plasma process chamber 105 can then be dissociated and converted into a plasma. As shown in FIG. 1, the exemplary system described utilizes both upper and lower RF sources. For example high-frequency electric power, for an exemplary capacitively coupled plasma system, in a range from about 3 MHz to 150 MHz may be applied from the upper RF source 130 and a low frequency electric power in a range from about 0.2 MHz to 40 MHz can be applied from the lower RF source. It will be recognized that the techniques described herein may be utilized with in a variety of other plasma systems. In one example system the sources may switched (higher frequencies at the lower electrode and lower frequencies at the upper electrode). Further, a dual source system is shown merely as an example system and it will be recognized that the techniques described herein may be utilized with other systems in which a frequency power source is only provided to one electrode, direct current (DC) bias sources are utilized, or other system components are utilized, etc.

In one embodiment, a non-contact embedded ferroelectric sensor is utilized to monitor Vdc of a plasma to provide data indicative of ion etch rate. The sensor is configured by embedding a passive circuit in a RF bias driven surface that has a DC field correlating to the substrate surface. Change is measured in the material polarization that results from the DC electric field. Measurements may be extracted using capacitive coupling (non-metal contact) signal transmission. Closed loop feedback of Vdc may be provided at the factory control system or the plasma system process control system.

In one embodiment, the sensor pickup may be placed under the plasma processing system focus ring. In another embodiment, the sensor may be directly embedded within the focus ring. In yet another embodiment, the sensor may be formed on the top of a chuck of the plasma processing system. In yet another embodiment, the sensor may be embedded in the chuck of the plasma processing system. It will be recognized, however, that a sensor utilized for determining Vdc levels in a plasma system may be located in other areas of the plasma system and the techniques described herein are not limited to the particular placement embodiments described herein.

Figure 2:
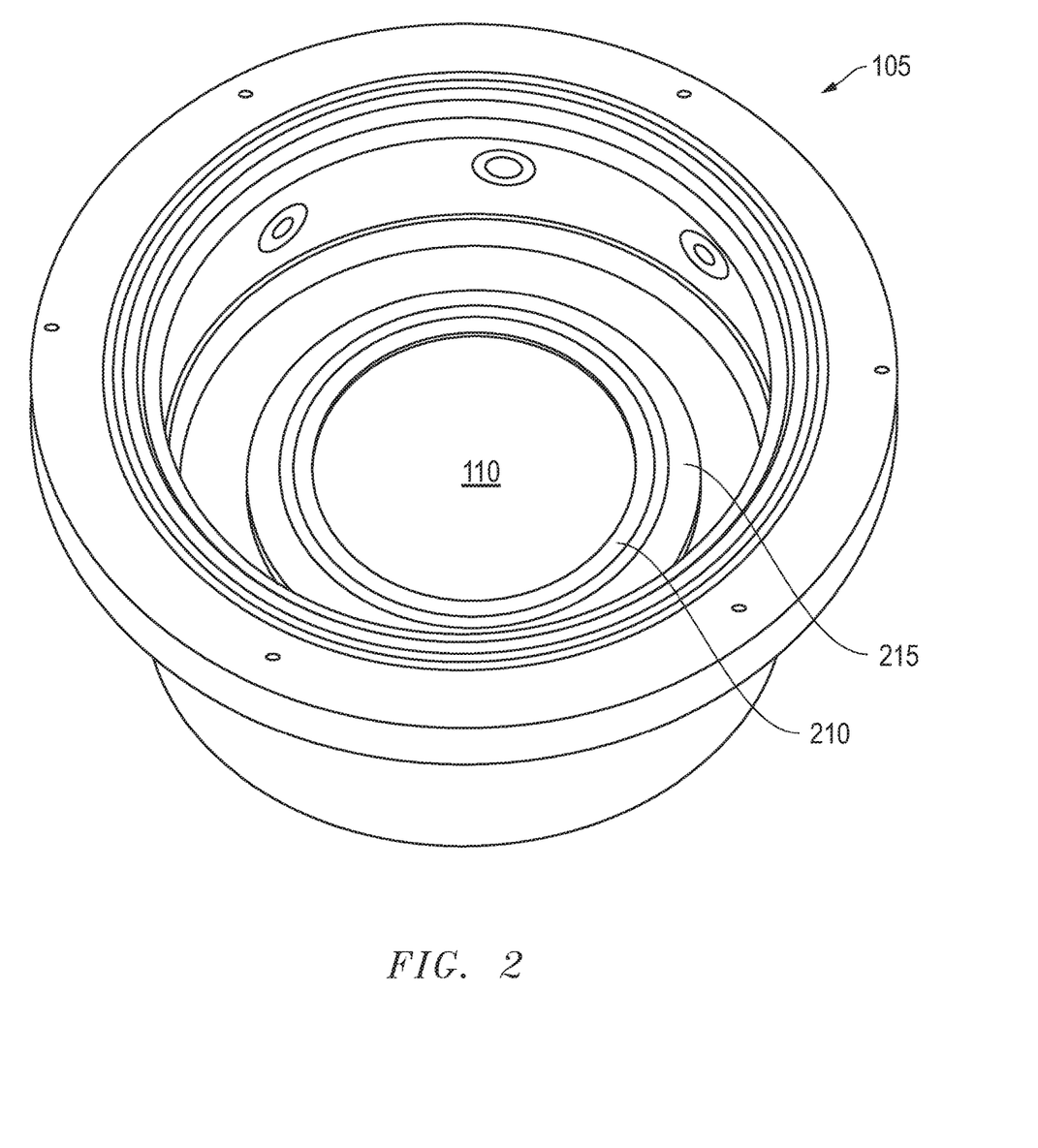
FIG. 2 illustrates an exemplary plasma process chamber.

FIG. 2 illustrates a perspective interior view of a plasma process chamber 105 having a wafer and focus ring. The use of focus rings in plasma processing is well known. For example, if the substrate is a wafer, a focus ring is typically an annular structure surrounding the wafer. The focus ring serves to confine a plasma, ameliorating discontinuity in a bias potential on a surface of the wafer due to fringing effects and helps provide a uniform and satisfactory plasma process at a peripheral portion of the semiconductor wafer. As shown in FIG. 2, a plasma process chamber 105 is provided. As shown a substrate 110 is surrounded by a focus ring 210 (which may in one example be quartz). A quartz skirt 215 is also provided.

Figure 3:
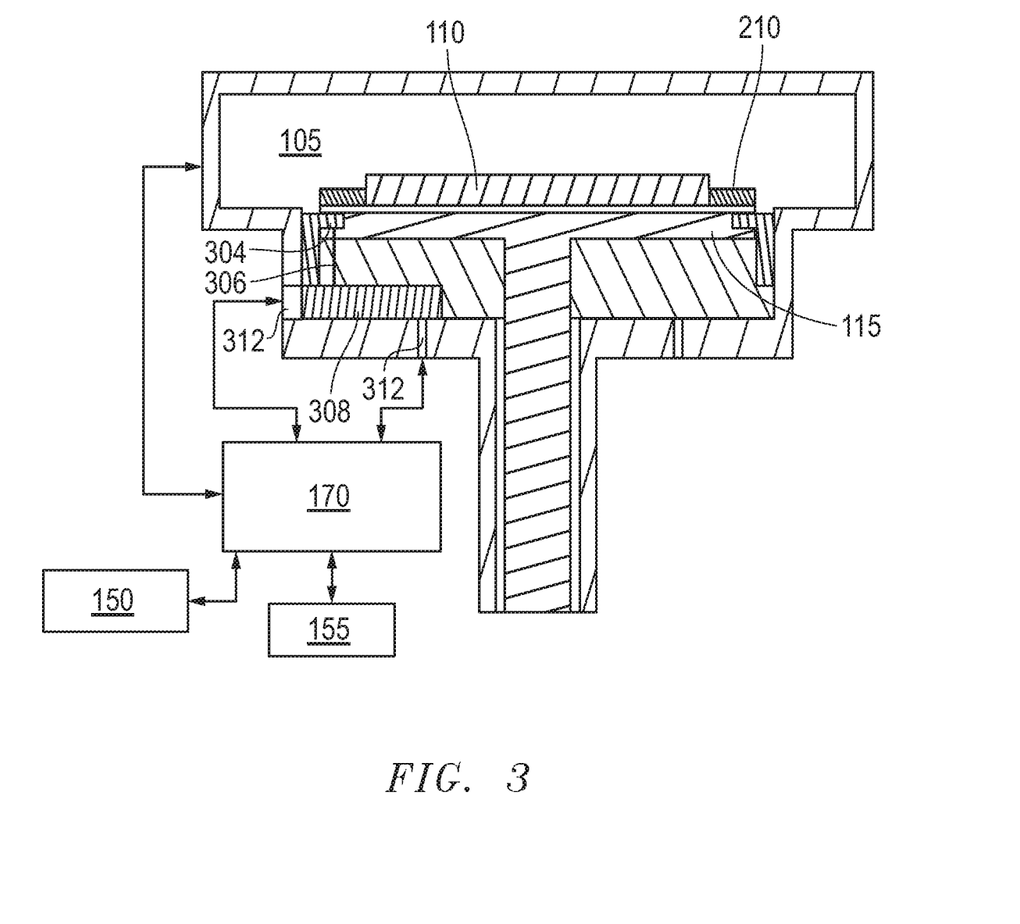
FIG. 3 illustrates a cross-section of a plasma processing system.

FIGS. 3 and 4 illustrate the placement of a Vdc sensor pickup within an exemplary plasma processing system. FIG. 3 is a cross-section diagram of an example embodiment for a plasma processing system 100 where one or more sensors 304 are used in a plasma process chamber 105 to obtain Vdc measurements within the plasma process chamber 105. A focus ring 210 is positioned adjacent and around a substrate 110, which can be in one example a semiconductor wafer or other material. The plasma process chamber 105 also includes a substrate holder or chuck 115, such as an electrostatic chuck, that supports the substrate 110. Process chemistries are injected into a processing region and used to etch material layers from and/or deposit layers on the substrate 110. For example, plasma gas chemistries can be injected into the plasma process chamber 105 and ignited to generate plasma that assists etch and/or deposition processes.

For the example embodiment shown in FIG. 3, a sensor 304 is positioned under the focus ring 210 and a connection wire 306 provides the sensor signal to sensor electronics 308. The sensor 304 can be a capacitive sensor, a varactor, or other measurement sensor. Further, one or more sensors 304 may be included to facilitate measurement of Vdc levels present in the system. The sensor electronics 308 may be coupled to the sensor 304 via a connection wire 306 (or other wired or wireless connections) to control the sensor 304 and convert measurements obtained at the sensor 304 to values representative of the conditions at the sensor 304. For example, for a capacitive sensor, capacitive sensor control integrated circuits are known in the art that can provide control and excitation signals to a capacitive sensor and receive the resulting capacitive measurements obtained from the sensor. Thus, it is noted that an integrated circuit that provides capacitance-to-digital conversion can be used in part to implement the sensor electronics 308. Such capacitance-to-digital converter integrated circuits are well-known to generate programmable excitation signals to excite a capacitor plate and can receive single-ended or differential return signals from the opposing capacitor plate(s).

The sensor control electronics may be positioned within the plasma process chamber 105 or may be positioned outside of the chamber. One or more communication paths 312 may be located to provide external communication access either to the sensor electronics (if the sensor electronics are located within the plasma process chamber 105) or provide access between the sensor 304 and the sensor electronics 308 (if the sensor electronics are located outside the plasma process chamber 105). The communication path 312 can be, for example, optical ports or windows, radio frequency (RF) ports or windows, and/or other communication paths that allow external communications into and out of the plasma process chamber 105. As described herein, the sensor 304 is used to measure electrical parameters that are indicative of Vdc levels within the plasma process chamber 105. The sensor electronics 308 may be placed in the system in any of a variety of positions and the location of FIG. 3 is merely exemplary.

As discussed above, in one embodiment, a control unit 170 is coupled to the sensor 304 through sensor electronics 308 and is coupled to the plasma process chamber 105 to control adjustments to process parameters or components for the plasma process chamber 105 as described herein. The control unit 170 may also be coupled to a memory 155 and data storage system 150 as described above.

The control unit 170 can be configured communicate with the sensor electronics 308 and/or the sensor 304 within the plasma process chamber 105 through a variety of techniques. For example, control unit 170 can include an RF transceiver configured to communicate with an RF transceiver included within the sensor electronics 308 where the communication path 312 is an RF port or window. Control unit 170 can include an optical transceiver to communicate with an optical transceiver included within the sensor electronics 308 where the communication path 312 is an optical port or window. Other wireless communication devices can also be used for the control unit and the sensor electronics. Further, wired communication connections can also be implemented between the control unit and the sensor electronics. It is further noted that the communications between the control unit and the sensor electronics can be unidirectional or bidirectional.

Figure 4A:
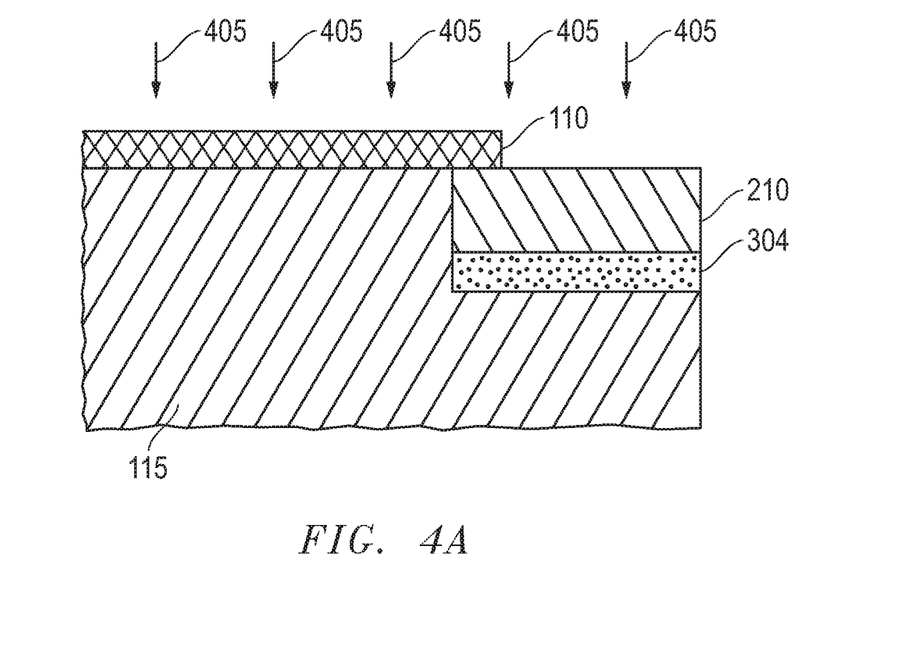
FIGS. 4A-4B illustrate exemplary locations for placement of a Vdc sensor.

FIG. 4A illustrates an expanded view at the edge of a substrate 110 on a chuck 115. As shown, a focus ring 210 is also provided. The direction of ions 405 used as part of the plasma process is also shown. As indicated in FIG. 4A, a sensor 304 is also provided. The sensor 304 designed in a wide range of manners. In one embodiment, the sensor may be a thin laminate ring located between the focus ring 210 and the chuck 115. In the case of a capacitive sensor, embedded within the sensor 304 may be capacitive plates and a ferroelectric capacitive material. In one embodiment, the sensor 304 may be separate from both the focus ring 210 and the chuck 115. The Vdc sensor of FIG. 4A may be formed by a thin laminated sensor ring surrounding the substrate (in this example a wafer). The thin laminated sensor ring includes a ferroelectric material and floating capacitor plates. Thus, the Vdc sensor includes a dielectric surface having capacitive measurement points in the dielectric surface of an RF driven electrode.

The location of the sensor 304 of FIG. 4A is merely exemplary. In another embodiment, the sensor 304 may be integrated or attached as part of the bottom of the focus ring 210. In an alternative embodiment, the sensor 304 may be integrated or attached as part of the top of the chuck 115. In yet another embodiment, the sensor may be embedded within the focus ring. In still yet another embodiment, the sensor may be embedded within the chuck. One advantage to forming the sensor within the chuck is that often the chuck may be temperature controlled and thus the sensor may also be relatively temperature controlled. To maintain uniform hardware characteristics (and accordingly plasma characteristics), the sensor may formed as a ring (in the case of the substrate being a wafer). Alternatively, the sensor may be located only at one position within the plasma process chamber 105. As mentioned, in a capacitive sensor embodiment, capacitive plates may be embedded in the sensor 304 as described in more detail below. Such capacitive plates may be located at one position in the sensor 304. Alternatively, multiple sets of capacitive plates may be located around the substrate 110 so as to provide multiple Vdc readings at different locations in the plasma process chamber 105. Such multiple sets of capacitive plates may be utilized to obtain Vdc uniformity measurements at various points within the plasma process chamber 105.

Figure 4B:
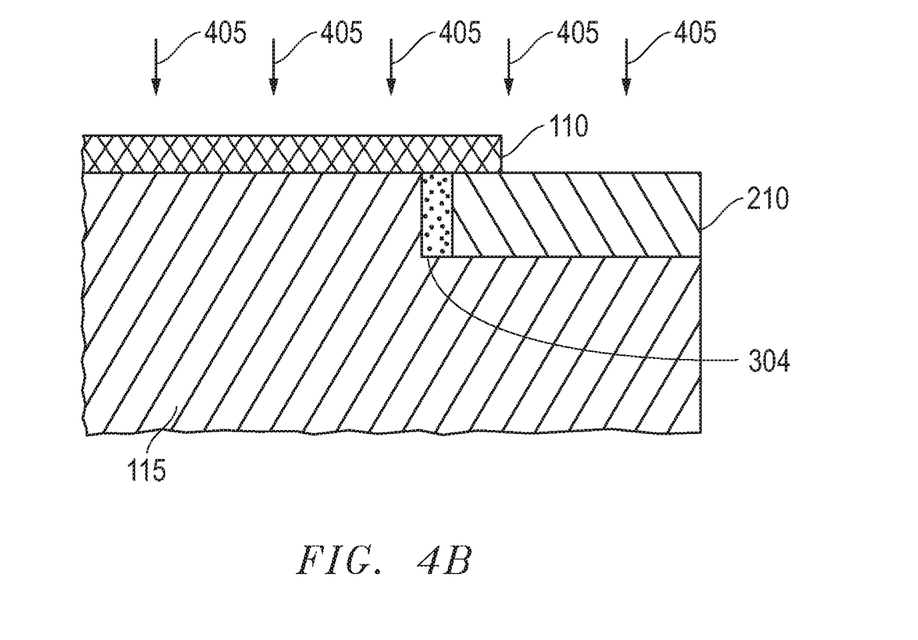
Figure 4C:
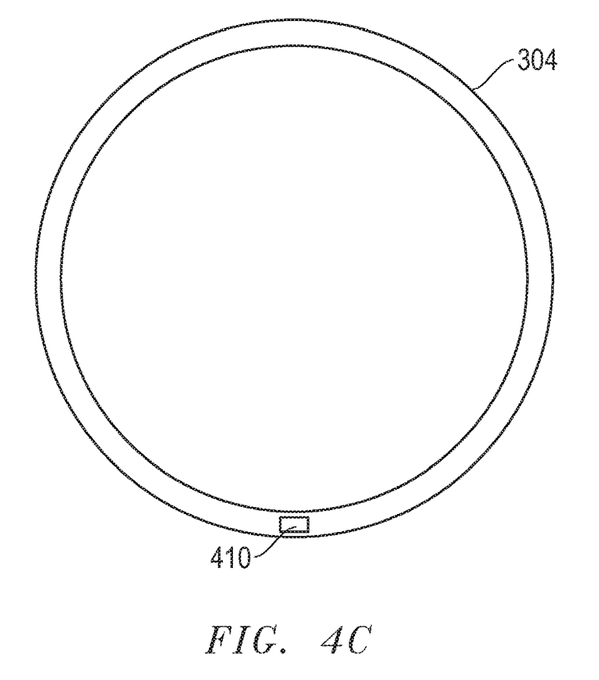
FIGS. 4C-4D illustrate exemplary locations for placement of measurement pickups on a Vdc sensor.
Figure 4D:
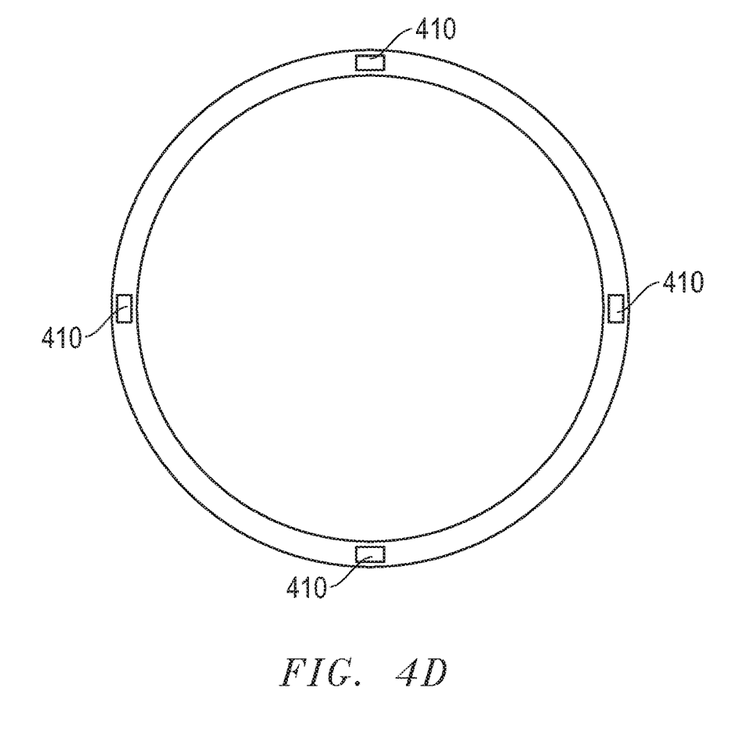

It will be recognized that the configuration of the sensor 304 of FIG. 4A is merely exemplary. FIG. 4B illustrates another exemplary configuration of the sensor 304 in relation to the substrate 110, chuck 115 and focus ring 210. The sensor 304 is not limited to the locations of FIGS. 4A and 4B and other locations may also be utilized within the plasma process chamber 105. For example, in one embodiment, the sensor 304 may be placed at the outer edge of the focus ring 210. As mentioned, a single measurement pickup may be utilized within the sensor 304 or alternatively multiple measurement pickups may be spaced around the substrate. FIG. 4C illustrates a top view of a sensor 304 which includes a single measurement pickup 410. In one example, the sensor may be a capacitive sensor and the measurement pickup may be formed by the use of a dielectric between capacitor plates such as described in more details in FIGS. 5A and 5B. In one embodiment, the capacitor plates of the measurement pickup 410 may be approximately 1 to 2 square millimeters. FIG. 4D illustrates an exemplary embodiment in which a plurality of measurement pickups 410 are embedded within the sensor 304. Thus, at least one measurement pickup is provided and in some embodiments, multiple pickups are provided. As shown, even when a single measurement pickup is utilized the sensor 304 may be configured to be symmetrical about the substrate 110 so as not to cause process non-uniformities within the plasma processing system 100. However, it will be recognized that the sensor need not be configured in such a manner and that the sensor 304 could be configured to conform just to the measurement pickup(s) 410.

Figure 5A:
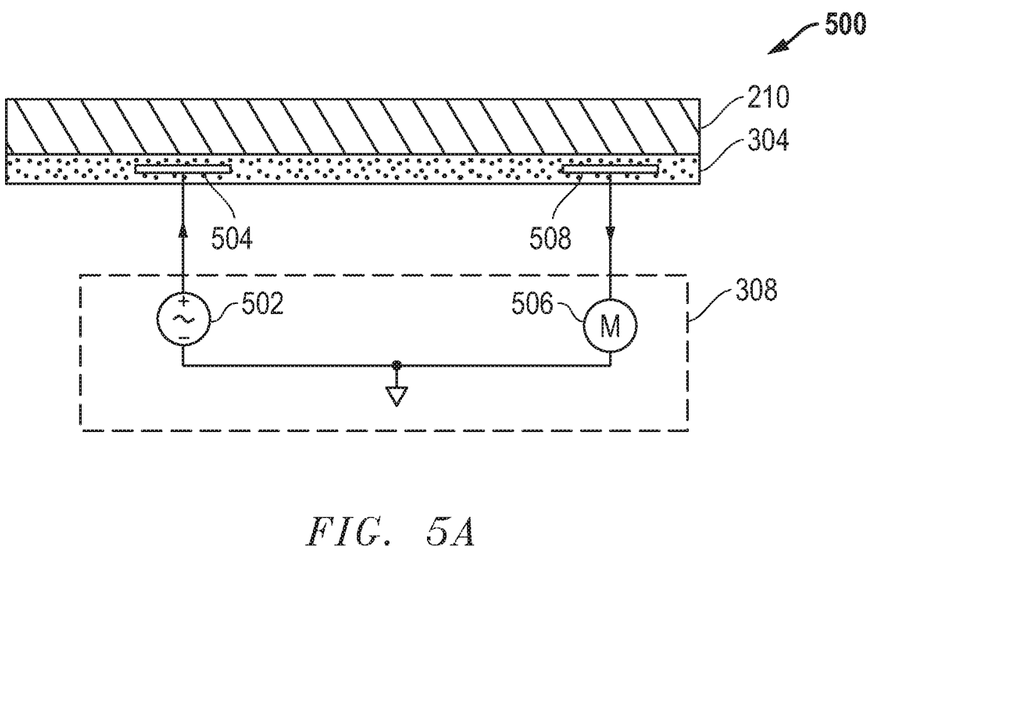
FIGS. 5A and 5B illustrate exemplary capacitive sensors and control circuitry for use with a Vdc sensor.
Figure 5B:
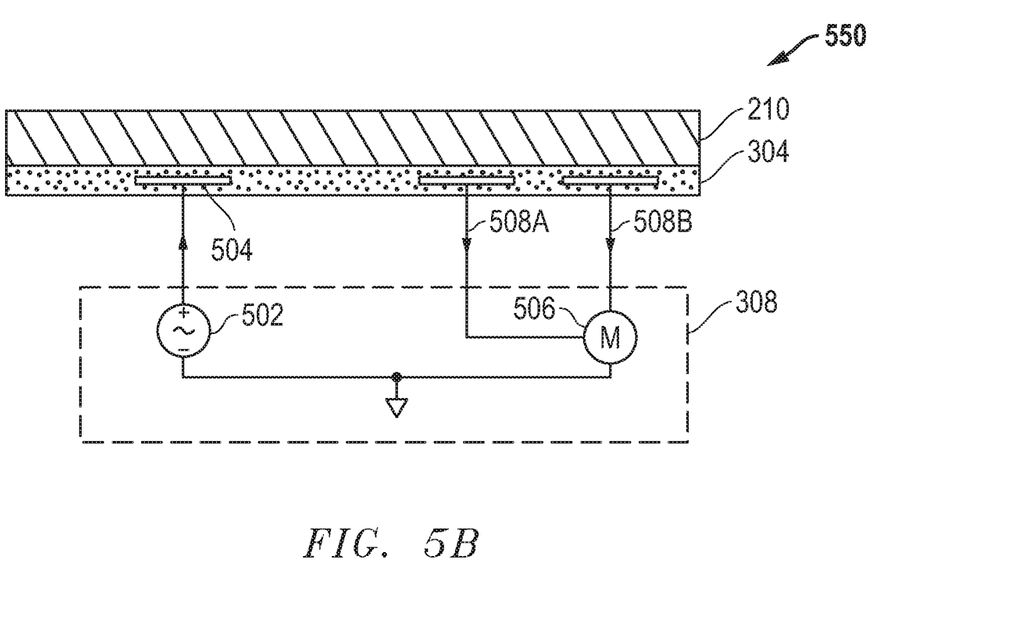

FIGS. 5A and 5B illustrate exemplary techniques for forming and operating a capacitive sensor for use in the sensor 304. As shown in FIG. 5A, a single ended capacitive sensor is provided. As shown in FIG. 5B, a differential capacitive sensor is provided. Thus, a variety of arrangements may be configured to provide a sensing capacitor in the sensor 304.

Looking first to FIG. 5A, an example embodiment 500 is provided for single-ended capacitive measurements with respect to a sensor 304. For the embodiment depicted, the focus ring 210 is positioned above the sensor 304. As discussed above, such configuration is merely exemplary. For example, the sensor 304 can be implemented as a ring shaped structure positioned underneath the focus ring 210. A capacitor is embedded within the dielectric layers of the sensor 304 by the formation of a first capacitor plate 504 and a second capacitor plate 508. The first capacitor plate 504 receives excitation signals from the signal generator 502. The capacitance is then measured with the use of the measurement circuit (M) 506 which is coupled to the second capacitive plate 508. The embodiment of FIG. 5A thus provides a single ended capacitive measurement. The signal generator 502 can generate an alternating current (AC) signal. The AC signal is applied at a first point represented by the first capacitor plate 504, and a capacitive measurement is made at a second point represented by the second capacitor plate 508. The signal generator 502 and the measurement circuit 506 may form part of the sensor electronics 308 discussed above. Commercially available sensor electronics are well-known for providing such functionality. For example, commercially available integrated circuits may include the signal generator 502 and the measurement circuit 506. The capacitive measurements may then be used to determine the Vdc levels within the plasma process chamber 105 as the detected capacitance levels correlates to the Vdc levels as discussed in more detail below. Further, changes in the Vdc levels may be indicated by changes in the measured capacitance levels.

FIG. 5B provides an example embodiment 550 for differential capacitive measurements with respect to a sensor 304. Embodiment 550 is similar to embodiment 500 except that the measurement circuit (M) 506 receives input signals from two capacitor pickup plates: a second capacitor plate 508A and a third capacitor plate 508B. These signals from the capacitor plates 508A/508B provide the differential capacitive measurement. The operation of embodiment 550 is otherwise the same as the operation of embodiment 500 described above except for the differential capacitive measurement using second capacitor plate 508A and third capacitor plate 508B rather than the single-ended capacitive measurement using one second capacitor plate 508 as shown in FIG. 5A.

It is noted that the signal generator 502 can be used to generate single and dual frequency excitation that can be used for single-ended measurements in FIG. 5A or for the differential measurements in FIG. 5B. For one embodiment, the output rate or frequency for the excitation signal generated by the signal generator 502 can be software programmable, and the output rate or frequency can be varied. In one embodiment frequencies of around 1 MHz are utilized. In other embodiments, low frequencies of less than 20 kHz and even lower than 100 Hz may be utilized.

The measurement pickup components may all be embedded within dielectric materials so that the various components are not exposed to the plasma of the plasma process chamber.

Figure 6:
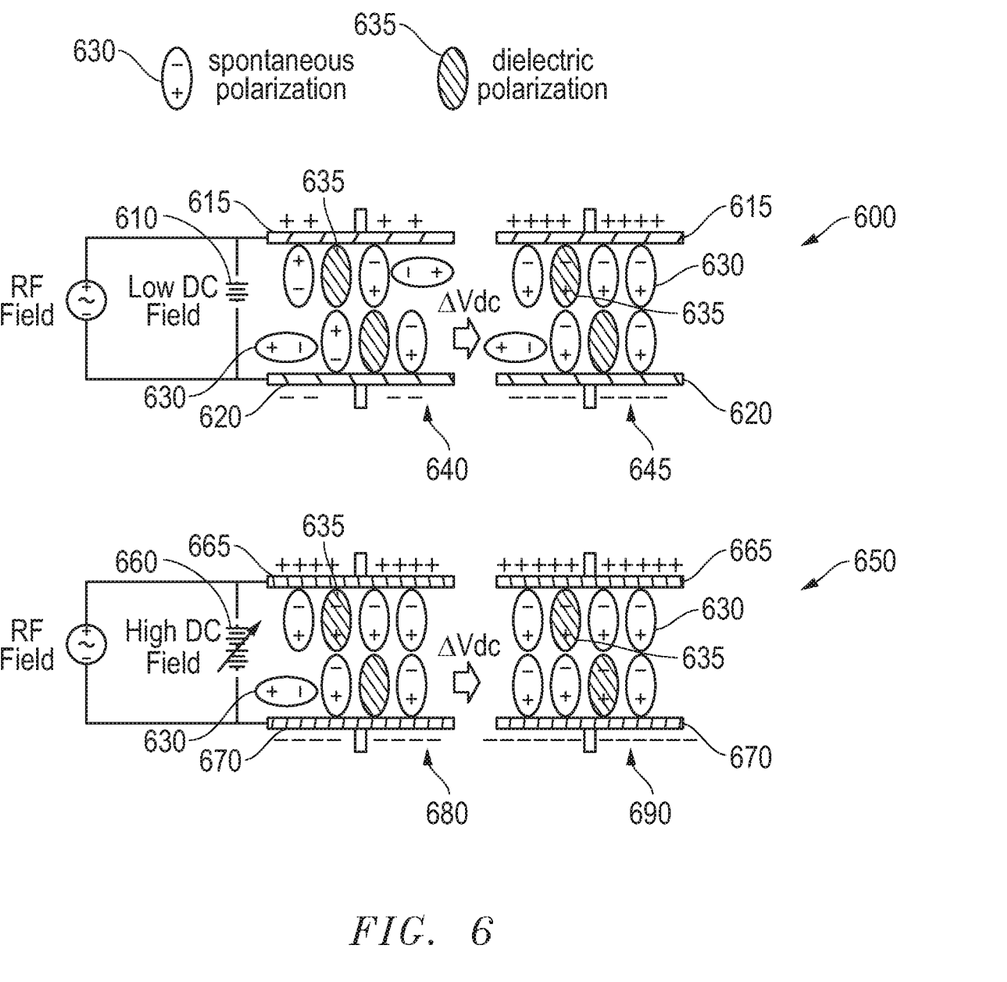
FIG. 6 illustrates the effects of a Vdc field applied to capacitive dielectric.
Figure 7:
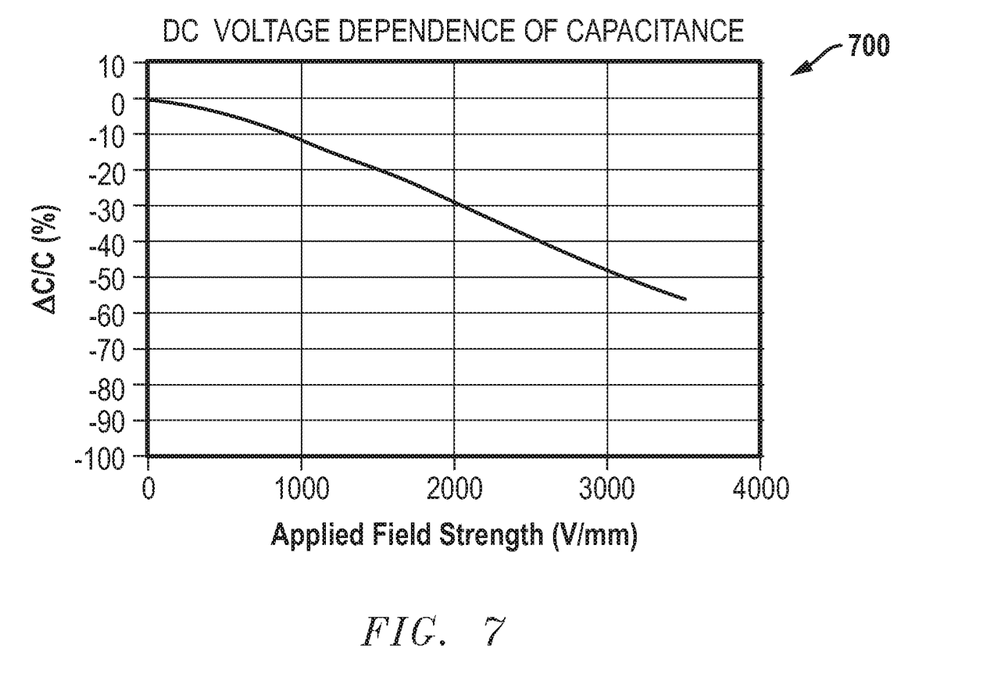
FIG. 7 illustrates the DC voltage dependence of capacitance for an exemplary capacitor.

As mentioned above, the Vdc measurements are obtained by recognizing that a relationship between the DC voltage and the capacitance of the sensor exists. More specifically, a change in the material dielectric constant occurs with changes in the DC electric field, and thus the capacitance changes with the DC electric field. FIGS. 6 and 7 illustrate this relationship. As shown in FIG. 6, the behavior of a material with an externally applied electric field is illustrated. More specifically, illustration 600 of FIG. 6 demonstrates a capacitor system in which capacitor plates 615 and 620 are shown for the application of a low electric field 610 caused by a low power RF applied to the chuck that causes an accompanying spontaneous polarization 630 and dielectric polarization 635 between those capacitive plates. As shown in illustration 600 a first state 640 provides a first amount of charge on the capacitive plates. A change in an external Vdc seen by the capacitive system will lead to changes in the polarizations and the accompany charges on the capacitor plates such as shown in state 645 of illustration 600. In this manner, changes in the dielectric properties may be detected by sensing capacitance changes of the capacitive system. Similarly, illustration 650 of FIG. 6 demonstrates a capacitor system in which capacitor plates 665 and 670 are shown for the application of a high DC field 660 and the accompanying spontaneous polarization 630 and dielectric polarization 635 between those capacitive plates. As shown in illustration 650, a first state 680 provides a first amount of charge on the capacitive plates. A change in an external Vdc seen by the capacitive system will lead to changes in the polarizations and the accompany charges on the capacitor plates such as shown in state 690 of illustration 650. In this manner, changes in the dielectric properties may be detected by sensing capacitance changes of the capacitive system.

In this manner, the Vdc levels of a plasma processing system may be obtained. The Vdc levels may then be correlated to ion energy and plasma density to better control and/or characterize the plasma process. The techniques described herein may be utilized to control and/or characterize a plasma process during real-time substrate processing. The techniques described herein may also be utilized to characterize a plasma processing system either initially or periodically so as to maintain process control throughout the use of the plasma processing system. In one embodiment, Vdc data may be collected when no plasma is present in the system so as to provide a Vdc calibration data point. Alternatively, a known Vdc level may be applied to the plasma processing system to provide a Vdc calibration point. In other embodiments, calibration data may be collected while generating basic argon plasmas, nitrogen plasmas, oxygen plasmas, etc. so that calibration data points may be obtained and used for comparison to more complex etch or deposition plasmas.

FIG. 7 illustrates an exemplary graph 700 which illustrates the capacitance dependence on DC voltage. As shown in FIG. 7, the percentage change in capacitance is plotted versus the applied field strength. Thus, utilizing the concepts of FIGS. 6 and 7, the Vdc changes in a plasma processing system may be detected by monitoring the capacitance changes resulting across a dielectric subjected to varying Vdc levels.

Figure 8:
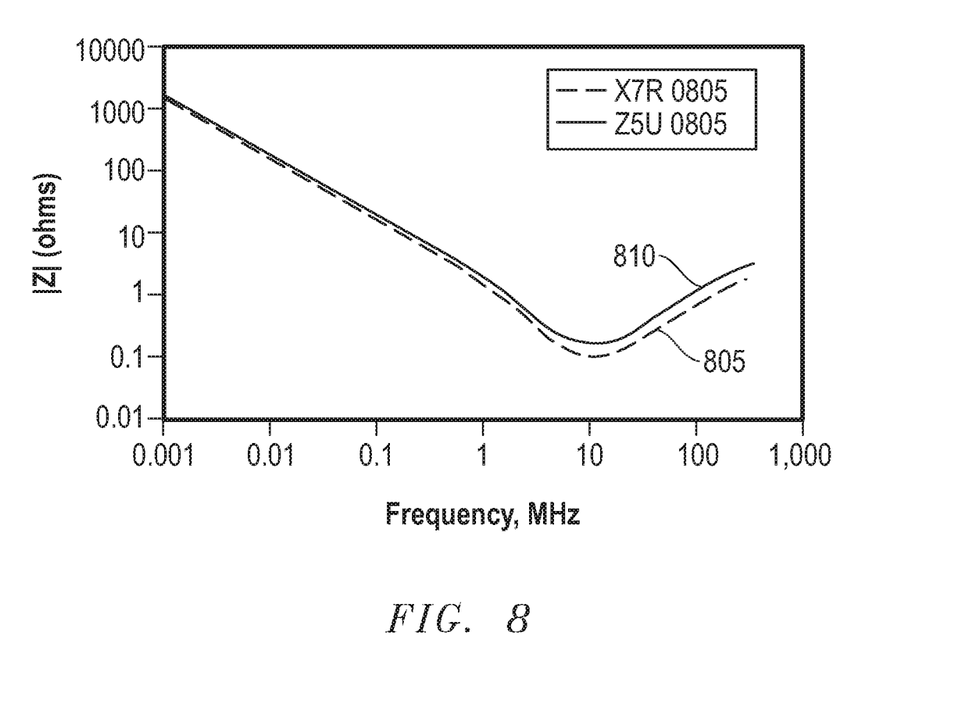
FIG. 8 illustrates the impedance versus frequency dependency for two exemplary capacitor dielectric materials.

It will also be recognized that a variety of design factors exist for the materials used to form the capacitor of the sensor 304. For example, X7R class or Z5U class ceramic capacitors types may be formed using ferroelectric materials. The particular materials used may provide differing capacitance versus DC voltage changes and different amounts of sensitive to temperature. Utilizing differential measurements may lessen the temperature sensitivity. Further RF fields (for example from a 13 MHz source) may have affect measurements and measurement circuitry (for example causing a circuitry short). In one embodiment, to lessen the RF effects the sensor may be designed so that the RF is isolated from the surface area, decoupled from the measurement circuit. A further factor to consider is that the impedance of the ceramic formulation will vary with frequency. FIG. 8 illustrates an exemplary impedance versus frequency relationship graph 805 for an X7R class of ceramic capacitor and graph 810 for an Z5U class of capacitor.

Any of a wide range of ferroelectric materials may be utilized including, for example, compounds of $PbNb_2O_2$, $ABO_3$, $Bi_4Ti_3O_{12}$, $Cd_2Nb_2O_7$, $BaTiO_3$, $PbTiO_3PT$, $Pb(Zr, Ti)TiO_3PZT$, $(Pb, Ls)(Zr, Ti)TiO_3PLZT$, $PbMg_{1/3}Nb_{2/3}O_3PMN$, $BiFeO_3$, $(Na, K)NbO_3$, etc. Other materials may also be used however.

The Vdc sensor described above has been described with relation to a capacitive plate sensor. However, it will be recognized that other Vdc sensors may be utilized which advantageously take advantage of capacitive changes that result from the presence of Vdc changes. For example, in another embodiment the capacitance—voltage characteristics of a diode may be utilized. For example, a varactor diode, varicap diode, variable reactance diode, etc. exploits the voltage dependent capacitance layer (for example the depletion layer or region) of a reverse biased p-n junction. Thus, the capacitance of the diode that is detected can be indicative of the bias voltage which can be correlated to the Vdc levels to which the diode is exposed. In this way, a Vdc sensor may be comprised of a diode which the detected capacitance is indicative of the Vdc levels.

Though described above with regard to a Vdc sensor placed in a plasma processing system, the concepts described herein may be incorporated directly on or within a substrate so as to provide a Vdc measurement near the surface of the substrate. Associated electrical circuits may also be contained or on within the substrate or only the pickup may be formed in the substrate. Electrical measurements may then be provided from the substrate so as to provide data indicative of the Vdc at the substrate surface. In this embodiment, associated control electronics and data collection electronics, data reporting electronics, etc. may also located on the surface of the substrate, for example covered with a protective material allowing exposure of the substrate to a plasma without damaging the electronics.

As mentioned above, the techniques described herein may be utilized in a wide variety of plasma systems. For example, the techniques may be applied to continuous wave plasma systems. Further the techniques may also be applied to pulsed plasma systems. In one embodiment, the techniques described herein are particularly advantageous for use with regard to pulsed plasma systems because the capacitance pickup values may be small enough to resolve the effects of pulsed plasmas. For example, the capacitance pickup may be in the picofarad range. This would allow measurements of a pulsed Vdc waveform that may result in a pulsed plasma system in which typical pulsing frequencies (0 to 10 kHz) are utilized. Thus, the capacitive sensor is fast enough to resolve the effects of the pulsed plasma waveforms generated in typical pulsed plasma systems.

Figure 9:
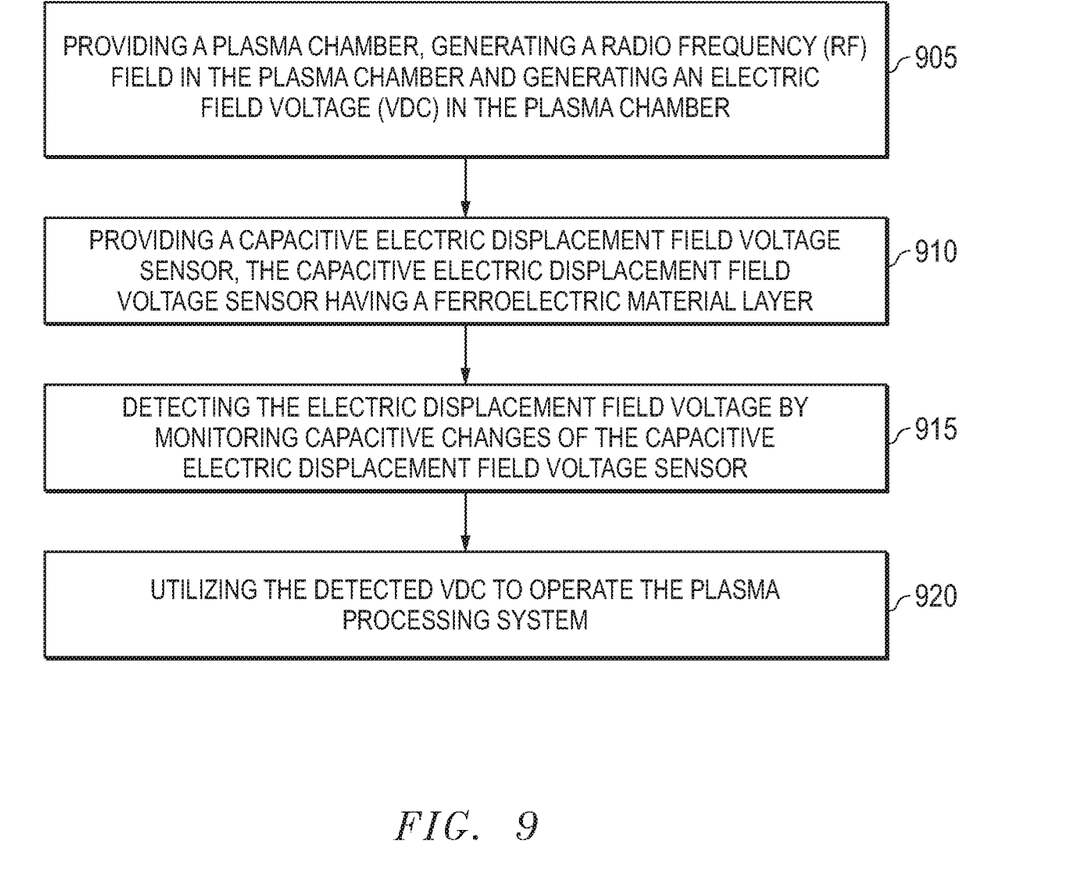
FIGS. 9 and 10 illustrate exemplary methods for utilizing the techniques described herein.
Figure 10:
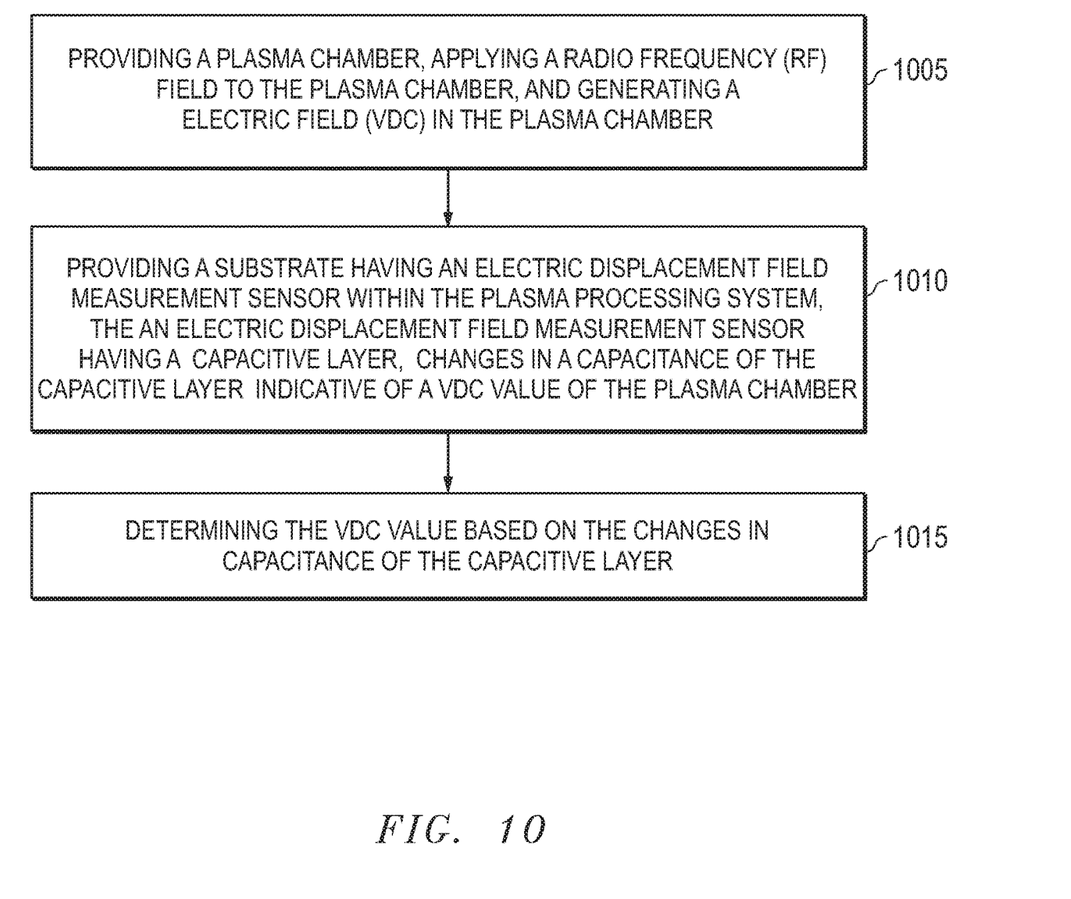

FIGS. 9-10 illustrate exemplary methods for use of the processing techniques described herein. It will be recognized that the embodiments of FIGS. 9-10 are merely exemplary and additional methods may utilize the techniques described herein. Further, additional processing steps may be added to the methods shown in the FIGS. 9-10 as the steps described are not intended to be exclusive. Moreover, the order of the steps is not limited to the order shown in the figures as different orders may occur and/or various steps may be performed in combination or at the same time.

FIG. 9 illustrates a method for operating a plasma processing system. The method comprises step 905 of providing a plasma chamber, generating a radio frequency (RF) field in the plasma chamber and generating an electric field voltage (Vdc) in the plasma chamber. The method further comprises step 910 of providing a capacitive electric displacement field voltage sensor, the capacitive electric displacement field voltage sensor having a ferroelectric material. The method also includes step 915 of detecting the electric displacement field voltage by monitoring capacitive changes of the capacitive electric displacement field voltage sensor. The method further includes step 920 of utilizing a detected VDC to operate the plasma processing system.

FIG. 10 illustrates a method for operating a plasma processing system. The method comprises step 1005 of providing a plasma chamber, applying a radio frequency (RF) field to the plasma chamber, and generating an electric field (Vdc) in the plasma chamber. The method further comprises step 1010 of providing a substrate having an electric displacement field measurement sensor within the plasma processing system, the an electric displacement field measurement sensor having a capacitive layer, and changes in a capacitance of the capacitive layer indicative of a Vdc value of the plasma chamber. The method further comprises step 1015 of determining the Vdc value based on the changes in capacitance of the capacitive layer.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and methods of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A plasma processing system configured to process a substrate, comprising:

a plasma chamber comprising a substrate holder and a focus ring;

a radio frequency (RF) source configured to apply an RF field to the plasma chamber to generate an RF plasma in the plasma chamber;

an electric displacement field measurement sensor comprising a capacitive dielectric layer attached to the focus ring, the capacitive dielectric layer being a ferroelectric material, the electric displacement field measurement sensor being configured to detect a change in polarization of the ferroelectric material during substrate processing, the electric displacement field measurement sensor comprising a sensing capacitor embedded within the capacitive dielectric layer attached to the focus ring, the sensing capacitor comprising two capacitor pickup plates disposed in the capacitive dielectric layer and configured to produce a differential capacitance signal; and control electronics coupled to the electric displacement field measurement sensor, the control electronics being configured to determine a direct current (DC) voltage (Vdc) of the RF plasma during a plasma process based on the change in the polarization, wherein the Vdc is the voltage between the substrate and a plasma sheath of the RF plasma.

2. The system of claim 1, wherein the sensing capacitor comprises a plurality of measurement pickups.

3. The system of claim 1, wherein the electric displacement field measurement sensor is ring shaped.

4. The system of claim 1, wherein the plasma processing system is a pulsed plasma processing system.

5. The system of claim 4, wherein the pulsed plasma processing system is operated at a frequency of up to 10 kHz.

6. The system of claim 1, wherein the sensing capacitor comprises a first capacitor plate, and the two capacitor pickup plates comprising a second capacitor plate and a third capacitor plate, the first, the second, and the third capacitor plates being embedded within the capacitive dielectric layer, the first capacitor plate being coupled to receive excitation signals from a signal generator configured to generate excitation signals at dual frequency, the second capacitor plate and third capacitor plate being coupled to a measurement circuit configured to measure a differential capacitance changes based on a change in polarization of the ferroelectric material due to the Vdc.

7. The system of claim 1, wherein the sensing capacitor comprises a plurality of measurement pickups that are symmetrically disposed along the focus ring such that the Vdc of the RF plasma is measured at multiple locations.

8. The system of claim 1, wherein the capacitive dielectric layer comprising the sensing capacitor is disposed along a sidewall of the focus ring.

9. A plasma processing system configured to process a substrate, comprising:
  a plasma chamber;
  a radio frequency (RF) source configured to apply an RF field to the plasma chamber and generate an RF plasma in the plasma chamber;
  an electric displacement field measurement sensor within the plasma processing system, the electric displacement field measurement sensor having a capacitive layer, changes in a differential capacitance of the capacitive layer indicative of a direct current (DC) voltage (Vdc) of the RF plasma, the capacitive layer comprising a first capacitor plate, a second capacitor plate, and a third capacitor plate, the first capacitor plate being coupled to receive excitation signals from a signal generator configured to generate excitation signals at dual frequency, the second capacitor plate and third capacitor plate being coupled to a measurement circuit configured to measure the changes in the differential capacitance; and
  control electronics coupled to the electric displacement field measurement sensor, the control electronics detecting the Vdc value based on the changes in the differential capacitance of the capacitive layer.

10. The plasma processing system of claim 9, wherein the capacitive layer is a ferroelectric material.

11. The plasma processing system of claim 10, wherein the electric displacement field measurement sensor is ring shaped.

12. The plasma processing system of claim 9, further comprising:
  a focus ring disposed around a substrate to be processed, wherein the capacitive layer is disposed along a sidewall of the focus ring.

13. The plasma processing system of claim 9, further comprising:
  a focus ring disposed around a substrate to be processed;
  a dielectric layer attached to the focus ring, the focus ring disposed between the dielectric layer and a plasma forming region of the plasma chamber;
  the first capacitor plate disposed in the dielectric layer; and
  the second capacitor plate and the third capacitor plate disposed in the dielectric layer, the first capacitor plate and the second and third capacitor plates being part of the electric displacement field measurement sensor.

14. A method for operating a plasma processing system; comprising:
  generating a plasma by applying a radio frequency (RF) field in a plasma chamber, the plasma establishing an electric field direct current (DC) voltage (Vdc) between the plasma and an electrode, the plasma chamber comprising a focus ring disposed around a substrate;
  providing a capacitive electric displacement field voltage sensor comprising a sensing capacitor comprising a capacitive dielectric layer with a ferroelectric material attached to the focus ring, the sensing capacitor embedded within the ferroelectric material, the sensing capacitor comprising two capacitor pickup plates disposed in the capacitive dielectric layer and configured to produce a differential capacitance signal;
  detecting the Vdc by monitoring capacitive changes of the capacitive electric displacement field voltage sensor due to the Vdc; and
  plasma processing the substrate while utilizing a detected Vdc to operate the plasma processing system, wherein the Vdc is the voltage between the substrate and a plasma sheath of the plasma.

15. The method of claim 14, wherein the sensing capacitor is embedded within a ring shaped structure.

16. The method of claim 14, wherein the plasma processing system is a pulsed plasma processing system, the capacitive electric displacement field voltage sensor detecting pulsed plasma Vdc changes.

17. The method of claim 14, further comprising:
  collecting Vdc calibration data before generating the plasma, the detected Vdc being based on the Vdc calibration data.

18. The method of claim 17, wherein the Vdc calibration data is collected with no plasma or with a plasma different than the plasma generated by the RF field.

19. The method of claim 14, further comprising:
  applying an alternating current (AC) signal at a first capacitor plate through a signal generator coupled to the first capacitor plate; and
  in response to applying the AC signal, receiving an input signal from the two capacitor pickup plates at a measurement circuit coupled to the two capacitor pickup plates, the first capacitor plate and the two capacitor pickup plates being embedded within the dielectric layer attached to the focus ring, the sensing capacitor comprising the first capacitor plate and the two capacitor pickup plates.

20. A method of operating a plasma processing system, comprising:

applying a radio frequency (RF) field to a plasma chamber and generate a RF plasma in the plasma chamber, the RF plasma establishing an electric field direct current (DC) voltage (Vdc) between the RF plasma and an electrode;

providing a substrate having an electric displacement field measurement sensor within the plasma processing system, the electric displacement field measurement sensor having a capacitive layer attached to a focus ring, changes in a differential capacitance of the capacitive layer indicative of a Vdc value of the Vdc in the plasma chamber;

measuring the changes in the differential capacitance of the capacitive layer using a measurement circuit coupled to a plurality of capacitor plates of the electric displacement field measurement sensor, the measuring comprising applying an alternating current (AC) signal at a first capacitor plate of the plurality of capacitor plates through a signal generator coupled to the first capacitor plate, and in response to applying the AC signal, receiving, at the measurement circuit, a first input signal from a second capacitor plate of the plurality of capacitor plates and a second input signal from a third capacitor plate of the plurality of capacitor plates, the measurement circuit coupled to the second capacitor plate and the third capacitor plate; and determining the Vdc value based on the changes in the differential capacitance.

21. The method of claim 20, wherein the capacitive layer is a ferroelectric material.

22. The method of claim 20, wherein the Vdc value provides data indicative of Vdc at a surface of the substrate.

23. The method of claim 20, further comprising plasma processing the substrate using the RF plasma while utilizing the determined Vdc to operate the plasma processing system.

* * * * *

UNITED STATES PATENT AND TRADEMARK OFFICE
CERTIFICATE OF CORRECTION

PATENT NO. : 12,272,520 B2
APPLICATION NO. : 16/506202
DATED : April 8, 2025
INVENTOR(S) : Merritt Funk Page 1 of 1

It is certified that error appears in the above-identified patent and that said Letters Patent is hereby corrected as shown below:

In the Claims

Claim 14, Column 14, Lines 31-38; delete:
"providing a capacitive electric displacement field voltage sensor comprising a sensing capacitor comprising a capacitive dielectric layer with a ferroelectric material attached to the focus ring, the sensing capacitor embedded within the ferroelectric material, the sensing capacitor comprising two capacitor pickup plates disposed in the capacitive dielectric layer and configured to produce a differential capacitance signal;"

And insert:
--providing a capacitive electric displacement field voltage sensor comprising a sensing capacitor, and comprising a capacitive dielectric layer with a ferroelectric material attached to the focus ring, the sensing capacitor embedded within the ferroelectric materiel, the sensing capacitor comprising two capacitor pickup plates disposed in the capacitive dielectric layer and configured to produce a differential capacitance signal;--.

Signed and Sealed this
Twenty-fifth Day of November, 2025

John A. Squires
*Director of the United States Patent and Trademark Office*